(12) United States Patent
Solovyov et al.

(10) Patent No.: US 9,837,814 B2
(45) Date of Patent: Dec. 5, 2017

(54) RADIO FREQUENCY-ASSISTED FAST SUPERCONDUCTING SWITCH

(71) Applicant: Brookhaven Science Associates, LLC, Upton, NY (US)

(72) Inventors: Vyacheslav Solovyov, Rocky Point, NY (US); Qiang Li, Setauket, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 480 days.

(21) Appl. No.: 14/385,094

(22) PCT Filed: Apr. 9, 2013

(86) PCT No.: PCT/US2013/035723
§ 371 (c)(1),
(2) Date: Sep. 12, 2014

(87) PCT Pub. No.: WO2014/011272
PCT Pub. Date: Jan. 16, 2014

(65) Prior Publication Data
US 2015/0045228 A1    Feb. 12, 2015

Related U.S. Application Data

(60) Provisional application No. 61/622,805, filed on Apr. 11, 2012.

(51) Int. Cl.
*H02H 9/02* (2006.01)
*H01L 39/20* (2006.01)
*H03K 17/92* (2006.01)

(52) U.S. Cl.
CPC .............. *H02H 9/023* (2013.01); *H01L 39/20* (2013.01); *H03K 17/92* (2013.01); *Y10T 29/49014* (2015.01)

(58) Field of Classification Search
CPC ..................... H02H 9/023; H01L 39/16–39/20
See application file for complete search history.

(56) References Cited

U.S. PATENT DOCUMENTS 3,956,727 A    5/1976  Wolf
4,803,456 A    2/1989  Benesch
(Continued)

FOREIGN PATENT DOCUMENTS

GB    2439764 A * 1/2008 ............ H02H 7/001

OTHER PUBLICATIONS

International Search Report of International Application PCT/US2013/035723—dated Jan. 9, 2014, 4 pages.
(Continued)

*Primary Examiner* — Stephen W Jackson
*Assistant Examiner* — Christopher Clark
(74) *Attorney, Agent, or Firm* — Dorene M. Price

(57) ABSTRACT

A radio frequency-assisted fast superconducting switch is described. A superconductor is closely coupled to a radio frequency (RF) coil. To turn the switch "off," i.e., to induce a transition to the normal, resistive state in the superconductor, a voltage burst is applied to the RF coil. This voltage burst is sufficient to induce a current in the coupled superconductor. The combination of the induced current with any other direct current flowing through the superconductor is sufficient to exceed the critical current of the superconductor at the operating temperature, inducing a transition to the normal, resistive state. A by-pass MOSFET may be configured in parallel with the superconductor to act as a current shunt, allowing the voltage across the superconductor to drop below a certain value, at which time the superconductor undergoes a transition to the superconducting state and the switch is reset.

16 Claims, 4 Drawing Sheets

(56) References Cited

U.S. PATENT DOCUMENTS

| | | | |
|---|---|---|---|
| 5,430,009 A * | 7/1995 | Wang | F41B 6/00 |
| | | | 310/16 |
| 5,805,036 A * | 9/1998 | Hodge | H01L 39/20 |
| | | | 174/125.1 |
| 6,236,545 B1 * | 5/2001 | McDougall | H02H 9/023 |
| | | | 361/141 |
| 6,472,966 B1 | 10/2002 | Ehrhart et al. | |
| 6,486,456 B1 * | 11/2002 | Moro | B23K 11/257 |
| | | | 219/765 |
| 6,809,910 B1 * | 10/2004 | Yuan | H01L 39/20 |
| | | | 335/216 |
| 6,894,406 B2 * | 5/2005 | Kinder | H01F 6/006 |
| | | | 307/125 |
| 7,701,677 B2 | 4/2010 | Schultz et al. | |
| 7,791,339 B2 | 9/2010 | Wong et al. | |
| 2002/0017970 A1 * | 2/2002 | Kinder | H01F 6/006 |
| | | | 335/299 |
| 2009/0302846 A1 | 12/2009 | Wong et al. | |
| 2011/0291489 A1 * | 12/2011 | Tsai | H02J 17/00 |
| | | | 307/104 |

OTHER PUBLICATIONS

Written Opinion of the Searching Authority of International Application No. PCT/US2013/035723—dated Jan. 9, 2014, 5 pages.

* cited by examiner

RADIO FREQUENCY-ASSISTED FAST SUPERCONDUCTING SWITCH

CROSS-REFERENCE TO A RELATED APPLICATION

This application claims the benefit under 35 U.S.C. 119(e) of U.S. Provisional Application No. 61/622,805 filed on Apr. 11, 2012, the disclosure of which is incorporated herein in its entirety.

STATEMENT OF GOVERNMENT RIGHTS

This invention was made with Government support under contract number DE-AC02-98CH10886, awarded by the U.S. Department of Energy. The Government has certain rights in the invention.

FIELD OF THE INVENTION

The present invention relates to superconducting devices that can rapidly transition a superconducting material between the superconducting state and the normal (resistive) state. More particularly, this invention relates to the design and application of novel radio frequency-assisted fast superconducting switch provided with one or more RF coils inductively coupled to the superconducting layer. It is contemplated that such a switch can be employed as a superconducting fault current limiter, a current switch, an active current limiter, or a fast persistent switch of a superconducting magnet.

BACKGROUND

An appealing feature of superconducting switching devices is practically zero conduction loss (resistance), which allows a scale-up of the device to a very high voltage and current without a penalty of added conduction loss. A widely used implementation of a superconducting switch is what is referred to as a fault current limiter that can be either resistive or inductive. In a resistive fault current limiter, the current passes through the superconductor and when a high fault current is created, the superconductor quenches. Specifically, the superconductor becomes a normal conductor and its resistance rises sharply and rather quickly. A resistive fault current limiter can be either DC or AC. If the fault current limiter is AC, then there will be a steady power dissipation from AC losses (i.e., superconducting hysteresis losses) resulting in rapid heating, which must be removed by the cryogenic system. An AC fault current limiter is usually made from wire wound non-inductively, otherwise the inductance of the device would create an extra constant power loss on the system. In contrast, an inductive fault current limiter is made from a transformer with a closed superconducting ring as the secondary. In un-faulted operation of the fault current limiter, there is no resistance in the secondary and so the inductance of the device is low. A fault current, however, quenches the superconductor. The secondary becomes resistive and the inductance of the entire device rises. The advantage of this design is that there is no heat ingress through current leads into the superconductor, and so the cryogenic power load may be lower. However, the large amount of iron needed in such devices means that inductive fault current limiters are much bigger and heavier than resistive fault current limiters.

The quench process in a superconductor is different between various types of superconductors. For example, the superconductor can be quenched by utilizing the non-linear property of the superconducting material, which rapidly becomes resistive when either one of the ambient factors, such as temperature (U.S. Pat. No. 4,803,456, incorporated herein by reference in its entirety), current, or magnetic field (U.S. Pat. No. 5,805,036, incorporated herein by reference in its entirety) exceed a certain critical value.

The easiest and the most reliable way to induce the transition is to heat the superconductor to a temperature above its superconducting critical temperature ($T_C$). For example, high temperature superconductors (HTS), such as $YBa_2Cu_3O_7$ (YBCO), quench when a small amount of non-superconducting current heats the material and raises it above 93 K. This can be accomplished by either by an external heater or by a radiant source, such as an infrared lamp (U.S. Pat. No. 6,472,966, incorporated herein by reference in its entirety). One known thermal superconducting switch includes a resistive wire wound about the superconducting wire. Normalization of the superconducting material in this system is effected by applying a DC current to the resistive wire, heating the superconducting material to above its critical temperature. In this conventional thermal superconducting switch, the resistive wire must be electrically insulated from the superconducting wire, for example by means of a layer of epoxy or by an insulating tape. Thermal conductivity of all common insulating materials falls with the temperature, therefore heat transfer at cryogenic conditions is usually slow and inefficient. However, because electrical insulating materials are also generally thermally insulating, poor thermal contact of the superconductor with the insulator results in a non-uniform heating, large thermal mass and slow operation of a thermal superconducting switch. The efficiency and speed with which the superconducting wire can be heated in these switches is, therefore, damped by the electrical insulator.

Moreover, the action of a superconducting switch, including the superconducting fault current limiter, depends on uniformity in the critical current of the tape. Since the superconducting tape is uniform at both micron scale and meter scale, heavy stabilization with the help of a stabilizer is required to prevent the superconductor from being damaged during the transition from the superconducting state to the normal state. The stabilizer adds thermal mass and makes the device inherently slow, especially during the recovery. Additionally a heavy copper stabilizer substantially reduces the "off" resistance of the device, thus limiting the role of the superconducting switch to that of the current limiter. As such, conventional thermally-switched superconducting switches with or without a stabilizer do not have sufficiently rapid switching times for many applications, such as SMES systems. Alternatively, radiant heating by means of lasers has been proposed (U.S. Pat. No. 3,956,727, incorporated herein by reference in its entirety). However because using lasers at cryogenic temperatures is impractical, they are rarely if ever used.

Therefore, there is still a continuing need to develop new fast superconducting switches that would allow for a rapid response time, and yet it would have a low-weight and remain stable.

SUMMARY

In view of the above-described problems, needs, and goals, a new superconducting switch is disclosed that relies on rapid transition of the superconducting material to the normal (resistive) state, which is induced by a strong radio-frequency (RF) field created by a RF coil inductively coupled to the superconducting layer. It is contemplated that the disclosed superconducting switch can be employed as a superconducting fault current limiter, a current switch, an active current limiter, or a fast persistent switch of a superconducting magnet.

In one embodiment, a flat superconducting tape is tightly wrapped around a flat RF coil. Direct current (DC) is passed though the tape. In the superconducting state the tape resistance is zero; this corresponds to "on" state. A high-frequency voltage, 100-200 kHz, is applied to the coil. Due to the strong coupling of the coil to the superconducting layer, large inductive currents are excited in the superconductor. Superposition of inductive currents and the DC current exceeds the critical current density of the material, which triggers a transition to the normal state. The transition is further assisted by hysteretic losses induced by the fast changing field and Joule losses due to the rising voltage.

These and other characteristics of the disclosed superconducting switch will become more apparent from the following description and illustrative embodiments, which are described in detail with reference to the accompanying drawings. Similar elements in each figure are designated by like reference numbers and, hence, subsequent detailed descriptions of such elements have been omitted for brevity.

DETAILED DESCRIPTION

A superconducting switch having low thermal mass and fast response time is disclosed. Specifically, such superconducting switch shows improved conduction, reduced switching losses, improved rated power and improved specific power. It is contemplated that such the disclosed superconducting switch can replace mechanical reclosers and fault current limiters in the medium voltage grid or at least offer an alternative to these devices. In one embodiment, the switch has (i) a superconducting tape, which is tightly wrapped around (ii) a flat RF coil. In another embodiment, the switch further has (iii) a low-impedance superconducting by-pass (e.g., MOSFETs) that in combination with the superconducting tape tightly wrapped around the flat RF coil affords a fast recovery of the switch. Traditionally superconducting switches (e.g., superconducting fault current limiters) rely on the shunting action of a low-resistance metal stabilizer (e.g., copper, aluminum or silver) for their superconductor recovery. The application of low-impedance MOSFETs allows for the use of an un-stabilized superconductor, substantially increasing the "off" resistance of the device.

In one exemplary embodiment, the switch provides: (i) a fast, under 5 ms, preferably under 2 ms, radio-frequency assisted switching of a large area superconducting layer. For example, a rapid non-thermal transition of a large-area YBCO layer from the normal to the superconducting state within 2 ms. The switch also, or in alternative, provides: (ii) a high "off" resistance enabled by dielectric buffer architecture with high break-down voltage. The high-breakdown dielectric buffer architecture allows for the elimination of the added conduction through the metal substrate. In another exemplary embodiment, the superconducting switch provides: (i) a fast (<2 ms) active (remotely controlled) opening triggered by inductively coupled radio-frequency (RF) flat coils, (ii) a high "off" resistance (>10 kΩ) enabled by a high-breakdown dielectric buffer, and (iii) an ultra-fast recovery due to the low thermal mass.

Figure 1A:
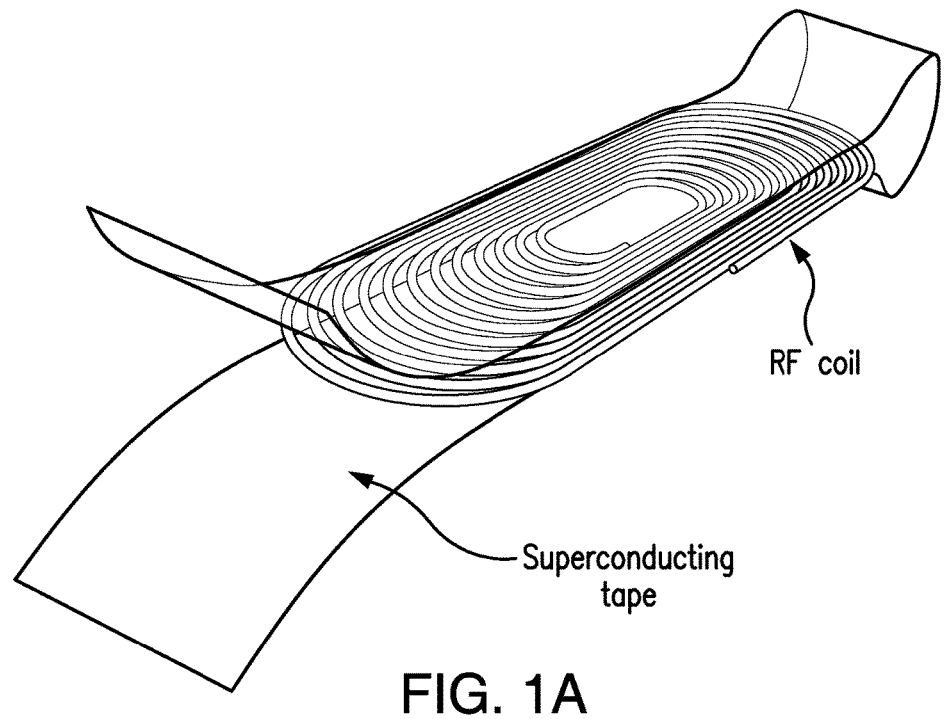
FIG. 1A shows a schematic rendering of the present RF-assisted superconducting switch structure.

As illustrated in FIG. 1A, the switch is constructed from a superconducting tape (or wire) that is tightly wrapped around a flat radio-frequency (RF) generating coil. The superconducting tape having the desired cross-sectional shape, such as a tape, a wire, a sheet and other similar shapes, and size is preferably superconductive at temperatures above 60 K, more preferably at temperatures between 60 and 110 K. For example, the superconducting tape can be fabricated from yttrium barium copper oxide (YBCO; $T_c$=93 K) or bismuth strontium calcium copper oxide (BiSCCO; Bi-2212 has $T_c$≈95 K, Bi-2223 has $T_c$≈108 K, and Bi-2234 has $T_c$≈104K) to form a superconducting layer between 0.5 and 10 μm in thickness, preferably about 1-2 μm YBCO layer deposited on a substrate tape made from nickel, nickel-tungsten alloy, stainless steel, or superalloy (e.g., hastelloy).

The superconducting tape can also have additional protective layers. For example, the superconducting tape can also have an oxide buffer layer to prevent electrical contact between the superconductor and the substrate tape. In addition to the oxide buffer layer, the superconducting tape can also have oxide layers designed to improve structural compatibility of the superconducting (e.g., YBCO) layer and the substrate. Although the use of high-temperature superconductors (HTS) is preferred in the fabrication of the superconducting tape, the principles of the disclosed RF-assisted superconducting switch are similarly applicable to other HTS materials, as well as to low-temperature superconductors (LTS). Other HTS materials may include other superconducting cuprates, iron chalcogenides, iron pnictides, $MgB_2$, etc. LTS suitable for use with the disclosed RF-assisted superconducting switch include elemental superconductors, $Nb_3Sn$, NbTi, etc. The superconductor material may be a Type I or Type II superconductor and may be described as "clean" or "dirty."

Once, the superconducting material of the tape or wire reaches a critical temperature, it becomes resistive. While the switch illustrated in FIG. 1A is shown with one superconducting tape element, the superconducting tape can include a plurality of tape elements and/or the same tape with a plurality of undulations that sandwich therebetween one or more flat RF coils. The number of superconducting tape elements in the switch is not particularly limited and can be as low as one and as high as 10. While the superconducting tape of the switch is illustrated in FIG. 1A as making one smooth turn (one undulation) around the flat RF coil, resulting in the leads being positioned near each other, in another embodiment the superconducting tape can also be arranged with multiple undulations that are either parallel to each other or at a selected angle. In such embodiments, the superconducting tape may have multiple undulations tightly wrapped around the RF coil so that the leads meet in a similar fashion as illustrated in FIG. 1A, or the leads may be displaced with reference to each other.

The superconducting tape can be constructed by conventional techniques, such as winding the tape on a round mandrel. A commercially available superconducting tape suitable for use in the disclosed superconducting switch is 1.2 micron thick YBCO layer deposited on a buffered Hastelloy substrate, which is available from SuperPower Corp. (Schenectady, N.Y.).

In addition to a superconducting tape, the switch has a flat RF coil fabricated from a material that can carry alternating current at frequencies up to about 1 MHz. Preferably, the RF coil is fabricated from a race-track shaped RF coil wound from multi-strand copper Litz wire (e.g., 18 gauge (equivalent) 50 strand Litz wire). Application of Litz wire helps to reduce eddy current losses in the coil. The coil is connected to a power source that can generate an alternating current (AC) at frequencies of 100 to 400 kHz, preferably 100 to 200 kHz. In one embodiment, the RF coil is between 1 and 3 mm thick, about 3 cm wide, and about 10 cm long.

It is contemplated that the benefits of the disclosed superconducting switch are achievable at a power level of greater than 1 kW (>1 kW), preferably between 1 kW and a 100 kW, more preferably between 1 kW and 50 kW, and most preferably between 1 KW and 10 KW. In one exemplary embodiment, the switch is a 100 kW (1 kV, 100 A) superconducting device capable of continuous switching at 60 Hz.

Figure 1B:
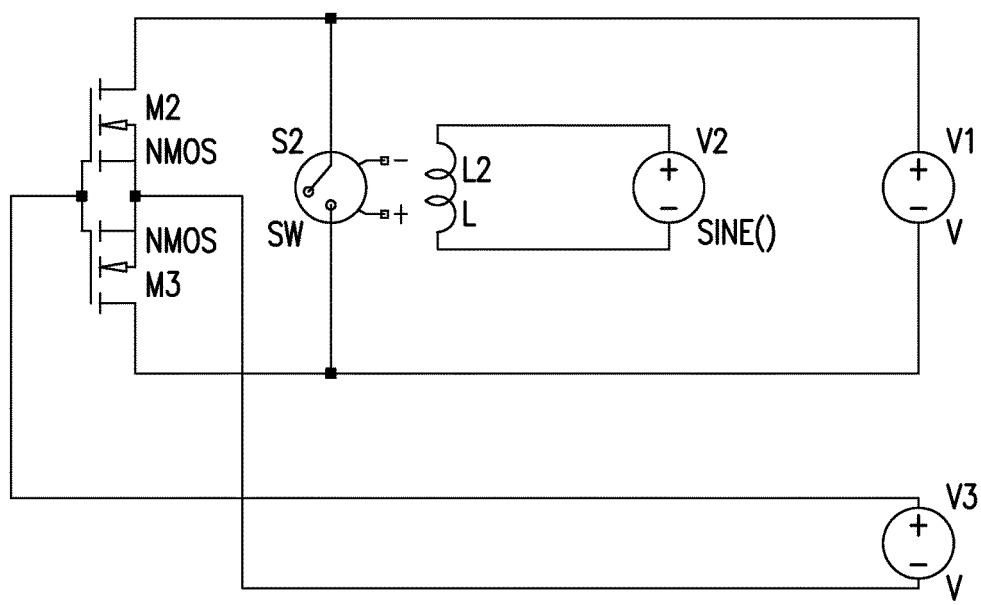
FIG. 1B shows a circuit schematic of the RF-assisted superconducting switch.

FIG. 1B illustrates a circuit setup of the superconducting switch. The superconducting switch tape (S2) is connected in parallel with the current source (V1) by two superconducting leads, that are preferably made from the same superconducting material as the superconducting switch tape (S2) itself. The direct current (DC) is passed though the superconducting switch tape (S2). In the superconducting state the tape resistance is zero. This corresponds to an "on" state. In one embodiment, the switch can transition into its resistive state by exceeding the critical current density of the superconducting material. The switch can exceed the critical current density of the superconducting material through the superposition of inductive AC currents of the RF coil (L2) and the DC currents of the superconducting tape (S2). The coil is excited by a resonant inverter (V2). The frequency of the inverter can be adjusted automatically or manually to meet the desired resonant conditions. Due to a strong coupling of the RF coil (L2) to the superconducting layer, large inductive currents are excited in the superconductor and drive large areas of an un-stabilized superconductor to the normal state. The transition is further assisted by hysteretic losses induced by the fast changing field and Joule losses due to the rising voltage. In contrast, traditional resistive heating would require an impractical amount of energy to achieve the same effect. For example, U.S. Pat. No. 7,701,677 to Schultz et al. (incorporated herein by reference in its entirety) describes an application of inductive coils to selectively heat areas of a superconducting magnet for the quench protection. However, in contrast to a disclosed RF-assisted superconducting switch, the Schultz device operates on the Joule heating principle, because the inductive power is delivered primarily to the copper stabilizer and not the superconducting layer.

In one embodiment, due to the high uniformity of the superconducting-normal transition under strong RF field, the superconductor does not have to be stabilized and can be easily protected during the transition by a superconducting bypass. Preferably the superconducting bypass is fabricated from one or more low-resistance metal oxide semiconductor field-effect transistors (MOSFETs) (e.g., M2 & M3 in FIG. 1B) mounted directly on the superconducting leads and operable at superconducting temperatures (e.g., between 60 and 77 K), which allows minimization of the resistance in the overall circuit. Specifically, the superconducting by-pass allows for the reduction of the thermal mass and enhancement of the "off" resistance by insulating and isolating the metal substrate from the superconducting layer by the use of a thick dielectric buffer layer. The superconducting by-pass can be opened during the transition period, preventing the voltage to rise to damaging levels. This opening during the transition period allows for the elimination of the passive metal protection layer of the superconducting wire. As illustrated in FIG. 1B, the opening and closing of the superconducting by-pass (i.e., MOSFETs M2 and M3) is regulated by a power source (V3).

Traditionally superconducting fault current limiters and superconducting switches rely on the shunting action of a low-resistance metal stabilizer (e.g., copper, aluminum or silver) for the superconductor recovery. The application of low-impedance MOSFETs allows using an un-stabilized superconductor, substantially increasing "off" resistance of the device.

The disclosed superconducting by-pass preferably includes one or more low-resistance metal oxide semiconductor field-effect transistors (typically referred to as power MOSFETs). The disclosed superconducting by-pass can suitably have 1, 2, 3, 4, or 5 power MOSFETS. The number of power MOSFETS is not particularly limited and can range between 1 and 10 depending on the configuration of the overall system. For example, in the disclosed superconducting switch, the superconducting by-pass has one power MOSFET, for each superconducting tape undulation, which is suitably positioned across from each tape and directly connected to the leads. Direct mounting of MOSFETs allows minimization of the overall circuit resistance. The power MOSFETS preferably have channel resistance minimums near 60 to 80 K for optimal protection and improved performance. An example of commercially an available power MOSFET that can be used in the disclosed superconducting switch is a 400 A IRFS3004-7PPBF, N-channel silicon based power MOSFET manufactured by International Rectifier Inc. (El Segundo, Calif.). The device features ultra-low resistance of the channel, below 900 $\mu\Omega$ at room temperature, which falls by a factor of 3 when the device is cooled down to 77 K. This property of the device enables development of an active, ultra-low resistance shunt that protects the superconducting switch during the transitions.

EXAMPLES

Example 1

FIG. 1B is a photograph of a small-scale prototype of a RF-assisted switch. The race-track shaped RF coil was wound from 18 gauge (equivalent), 50 strand Litz wire. The coil is excited by a custom-built 100 kHz resonant inverter, comprised of a MOSFET half-bridge and a coupling transformer, designed to match the impedance of the bridge and the coil. The transformer is manufactured from 3" ferrite core rings. The coil and a capacitor bank form a resonant circuit; the frequency of the inverter is manually adjusted to meet the resonant conditions.

Example 2

Figure 2A:
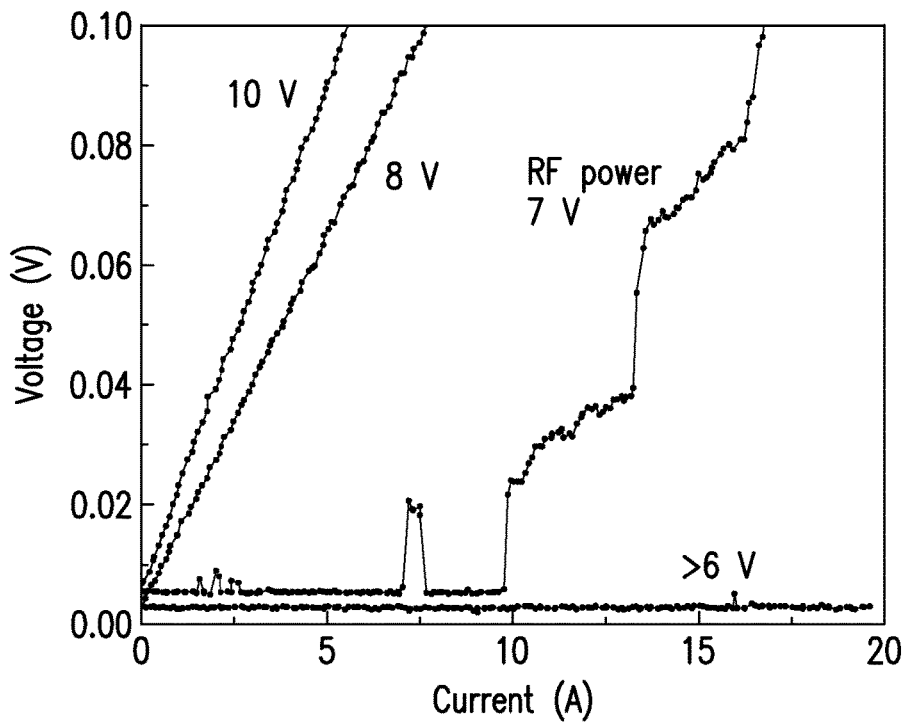
FIG. 2A shows the relationship between current and voltage at different RF levels, measured as volts on the coil.

FIG. 2A presents static I-V curves of a superconducting tape coupon under various levels of RF power, expressed as voltage on the coil. The superconducting tape is a 1.2-micron thick $YBa_2Cu_3O_7$ (YBCO) layer deposited on a buffered Hastelloy substrate manufactured by SuperPower Inc. (Schenectady, N.Y.). The changes from the superconducting state at low (<6 V) power to the normal (resistive) state are observed at power levels higher than 7 V.

Figure 2B:
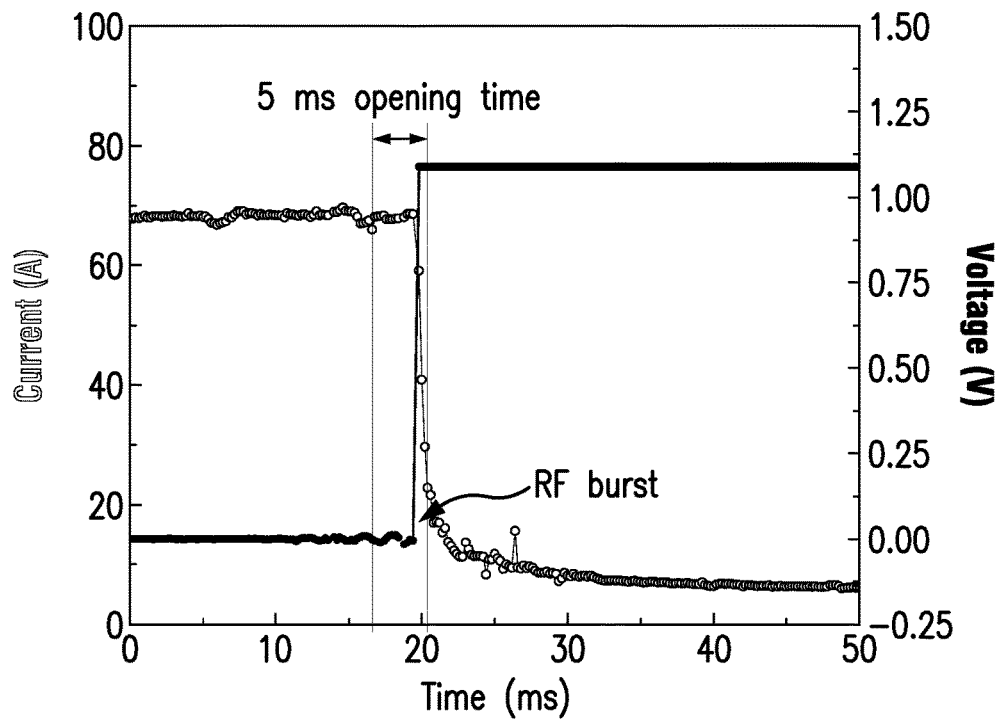
FIG. 2B shows the development of current and voltage over time when the device is subjected to a 5-ms RF burst.

FIG. 2B illustrates the speed of the RF-assisted switch as a matter of voltage rise and the current (A) drop within milliseconds of RF coil activation. Specifically, an application of a 5-ms RF burst is sufficient to drive the whole tape from the superconducting to the normal (resistive) state.

Example 3

Figure 3A:
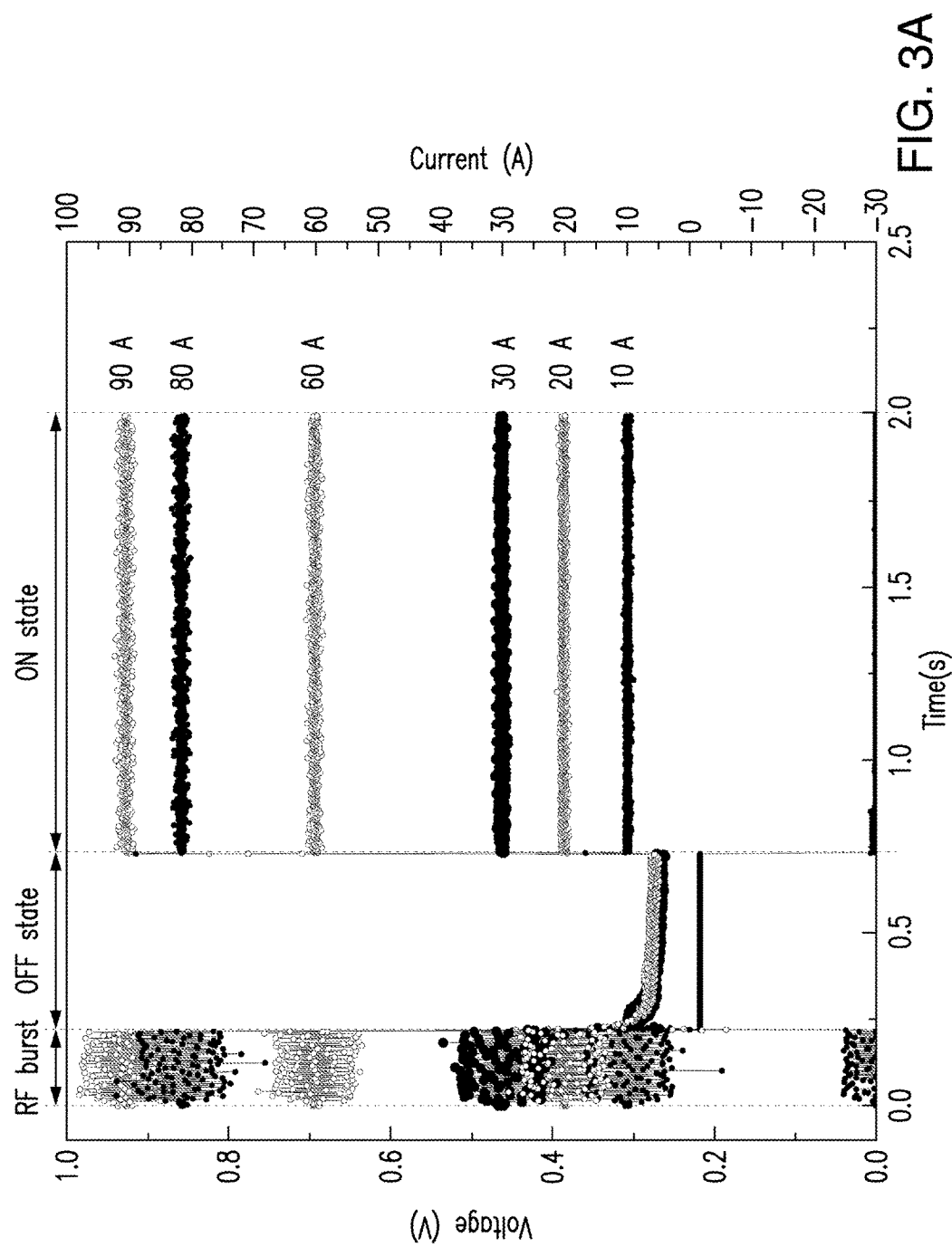
FIG. 3A shows the operation of the RF-assisted superconducting switch at a fixed voltage for several current levels.
Figure 3B:
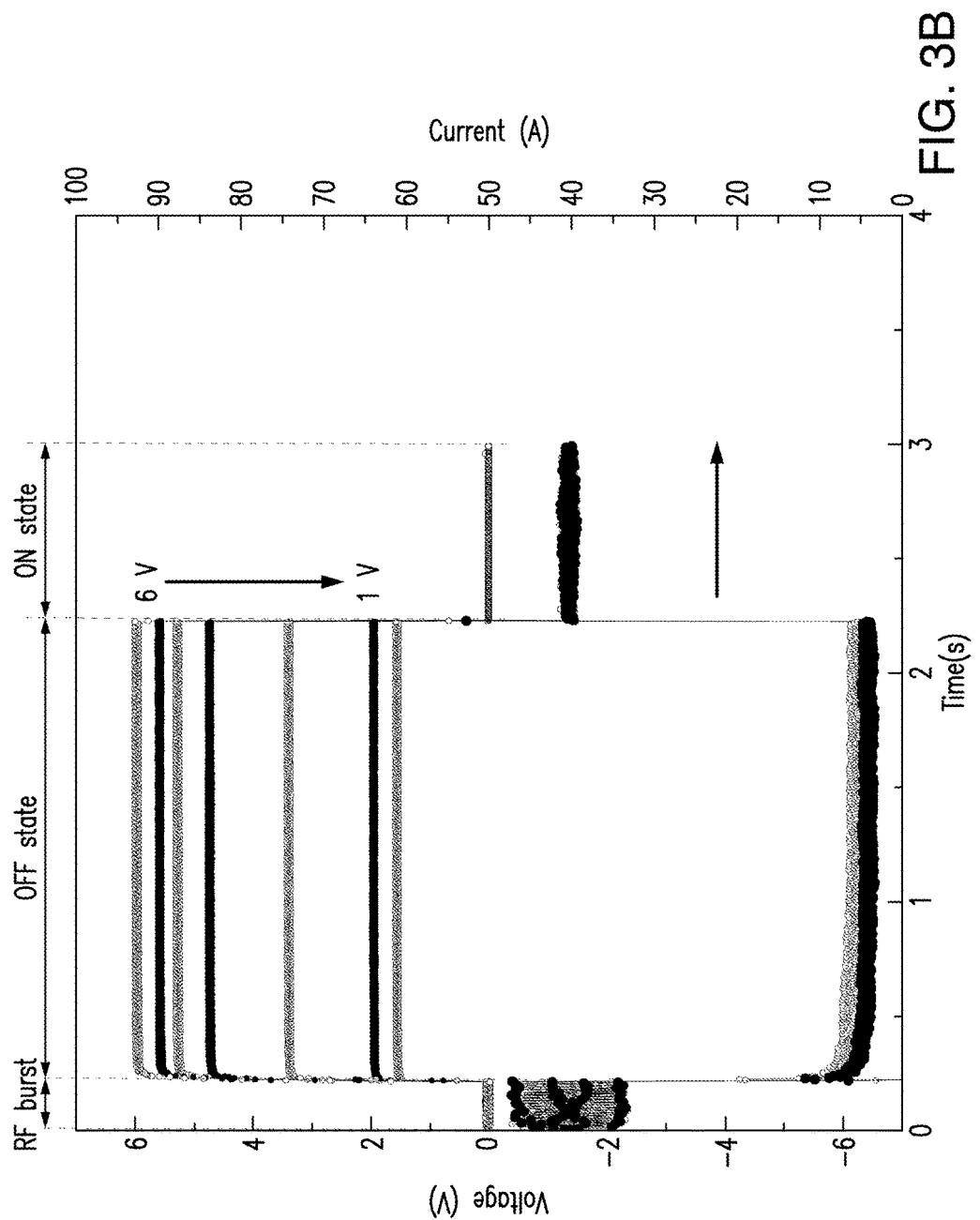
FIG. 3B shows the operation of the RF-assisted superconducting switch at a fixed current for several voltage levels.

During the opening of the by-pass MOSFETS shown in FIG. 1B, the superconducting switch can be closed. The by-pass MOSFET acts as a low-resistance shunt to the superconducting layer, allowing transition back to the superconducting state. FIGS. 3A and 3B show operation of the RF-assisted superconducting switch and the various current (FIG. 3A) and voltage levels (FIG. 3B).

FIG. 3A demonstrates commutation of DC current up to 90 A. The arrows on the top of the plot denote the transition period (application of the RF burst), the "off" state, corresponding to the normal state, and the "on" state corresponding to the superconducting state. A set of time profiles in FIG. 3B shows operation of the switch at voltage levels ranging from 1 to 6 V and a fixed current of 40 A. These figures demonstrate that speed of the switch operation is independent of applied voltage and current. Cyclic operation has also been achieved at a rate of 10 Hz at a current of 50 A.

All publications and patents mentioned in the above specification are incorporated by reference in their entireties in this disclosure. Various modifications and variations of the described materials and methods will be apparent to those skilled in the art without departing from the scope and spirit of the invention. Although the disclosure has been described in connection with specific preferred embodiments, it should be understood that the invention as claimed should not be unduly limited to such specific embodiments. Indeed, those skilled in the art will recognize, or be able to ascertain using the teaching of this disclosure and no more than routine experimentation, many equivalents to the specific embodiments of the disclosed invention described. Such equivalents are intended to be encompassed by the following claims.

The invention claimed is:

1. A superconducting switch, comprising:
   a superconducting tape;
   a radio frequency (RF) coil strongly coupled to the superconducting tape, where the superconducting tape is tightly wrapped around the RF coil with at least one undulation forming at least one smooth turn around the RF coil; and
   an RF inverter that induces a voltage burst in the RF coil, where the voltage burst induces a RF-induced current in the superconducting tape, where the RF-induced current and a direct current in the superconducting tape exceed a critical current of the superconductor tape at an operating temperature.

2. The superconducting switch of claim 1, wherein the superconducting switch is a superconducting fault current limiter.

3. The superconducting switch of claim 1, wherein the superconducting tape is superconductive at temperatures above 60 K.

4. The superconducting switch of claim 1, wherein the superconducting tape is made from yttrium barium copper oxide (YBCO; Tc=93 K) or bismuth strontium calcium copper oxide (BiSCCO; Bi-2212 has Tc≈95 K, Bi-2223 has Tc≈108 K, and Bi-2234 has Tc≈104K) to form a superconducting layer deposited on a substrate made from nickel, nickel-tungsten alloy, stainless steel, or superalloy.

5. The superconducting switch of claim 1, wherein the RF coil is made from a material that can carry alternating current at frequencies up to about 1 MHz.

6. The superconducting switch of claim 5, wherein the RF coil is made from a race-track shaped RF coil wound from multi-strand Litz wire.

7. The superconducting switch of claim 1, further comprising:
   a by-pass MOSFET coupled in parallel with the superconducting tape, wherein the by-pass MOSFET is operable to provide a low-resistance shunt to the superconducting tape that prevents damage of a superconducting layer during transition of the superconducting tape into the normal state from the superconducting state and into the superconducting state from the normal state.

8. The superconducting switch of claim 1, wherein a switching time of the superconducting tape from a superconducting into a normal state is less than 5 ms.

9. The superconducting switch of claim 8, wherein the switching time of the superconducting tape from its normal state into its superconducting state is less than 5 ms.

10. The superconducting switch of claim 1, having an "off" resistance of greater than 10 kΩ.

11. A method of fabricating a fast superconducting switch, the method comprising:
    strongly coupling a radio frequency (RF) coil to a superconducting tape by tightly wrapping the superconducting tape around the RF coil with at least one undulation forming at least one smooth turn around the RF coil;
    connecting the RF coil to an RF inverter, such that
    the RF inverter is operable to induce a voltage burst in the RF coil, where the voltage burst induces a RF-induced current in the superconducting tape, where the RF-induced current and the direct current in the superconducting tape exceed a critical current of the superconducting tape at an operating temperature.

12. A method of operating a superconducting switch, the method comprising:
    applying a high-frequency voltage burst to a radio frequency (RF) coil,
    wherein the RF coil is strongly coupled to a superconducting tape by tightly wrapping the superconducting tape around the RF coil with at least one undulation forming at least one smooth turn around the RF coil,
    the superconducting tape has flowing through it a direct current with a magnitude less than a critical current of the superconducting tape at an operating temperature,
    the high-frequency voltage burst is sufficient to induce a RF-induced current in the superconducting tape, the sum of the RF-induced current and the direct current exceeding the critical current of the superconducting tape at the operating temperature, and
    whereby the superconducting tape excited with the RF-induced current undergoes a transition from a superconducting state to a normal state.

13. The method of claim 12 further comprising:
    configuring a by-pass MOSFET in parallel with the superconducting tape, such that the bypass MOSFET is operable to shunt current from the superconducting tape that prevents damage of a superconducting layer during transition of the superconducting tape into its normal state, and reduces the voltage across the superconducting tape below a certain value which allows the superconducting switch to become superconducting.

14. The method of claim 13, wherein the transition from the superconducting state into the normal state of the superconducting tape takes less than 5 ms.

15. The method of claim 14, wherein when the direct current and the RF-induced current are shunted from the superconducting tape the critical current of the superconducting tape is no longer exceeded and the superconducting tape undergoes a transition into its superconducting state from its normal state.

16. The method of claim 15, wherein the transition into the superconducting state of the superconducting tape takes less than 5 ms.

* * * * *

UNITED STATES PATENT AND TRADEMARK OFFICE
CERTIFICATE OF CORRECTION

PATENT NO. : 9,837,814 B2
APPLICATION NO. : 14/385094
DATED : December 5, 2017
INVENTOR(S) : Solovyov et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 481 days.

Signed and Sealed this
Nineteenth Day of June, 2018

Andrei Iancu
*Director of the United States Patent and Trademark Office*